United States Patent
Shih et al.

(10) Patent No.: US 11,088,209 B2
(45) Date of Patent: Aug. 10, 2021

(54) PIXEL STRUCTURE OF ORGANIC LIGHT EMITTING DIODE DISPLAY

(71) Applicant: SHANGHAI TUO KUANG OPTOELECTRONIC TECHNOLOGY CO., LTD., Shanghai (CN)

(72) Inventors: Kuo-Hsing Shih, Shanghai (CN); Chia-Chen Li, Shanghai (CN); Chin-Rung Yan, Shanghai (CN)

(73) Assignee: SHANGHAI TUO KUANG OPTOECLECTRONIC TECHNOLOGY CO., LTD., Shanghai (CN)

(*) Notice: Subject to any disclaimer, the term of this patent is extended or adjusted under 35 U.S.C. 154(b) by 0 days.

(21) Appl. No.: 16/050,009

(22) Filed: Jul. 31, 2018

(65) Prior Publication Data

US 2019/0043932 A1 Feb. 7, 2019

Related U.S. Application Data

(60) Provisional application No. 62/540,050, filed on Aug. 1, 2017.

(30) Foreign Application Priority Data

Jun. 21, 2018 (CN) .......................... 201810642102.1

(51) Int. Cl.
*H01L 27/32* (2006.01)

(52) U.S. Cl.
CPC ........ *H01L 27/3213* (2013.01); *H01L 27/323* (2013.01); *H01L 27/3216* (2013.01); *H01L 27/3218* (2013.01); *H01L 27/3225* (2013.01); *H01L 27/3227* (2013.01)

(58) Field of Classification Search
None
See application file for complete search history.

(56) References Cited

U.S. PATENT DOCUMENTS

| | | | |
|---|---|---|---|
| 6,882,364 B1* | 4/2005 | Inuiya ..................... | H04N 9/045 348/237 |
| 8,780,019 B2* | 7/2014 | Choi ..................... | G09G 3/3208 345/77 |
| 9,262,961 B2* | 2/2016 | Shih ...................... | G09G 3/3225 |
| 10,692,940 B2* | 6/2020 | Liu ....................... | G09G 3/3225 |
| 10,943,955 B2* | 3/2021 | Wang ..................... | G02F 1/1335 |

(Continued)

*Primary Examiner* — Nishath Yasmeen

(57) ABSTRACT

A pixel structure of an organic light emitting diode display comprises a substrate and a plurality of pixels arranged on the substrate. The plurality of pixels is closely arranged. Each of the pixels is a light-emitting region. Each of the pixels comprises a plurality of sub-regions arranged in at least one column. Each sub-region of each of the column of the pixels comprises a color sub-pixel, a transparent sub-pixel or a sensing component. At least one of the pluralities of sub-regions of each pixel is the sensing component and the sensing component is arranged in the light-emitting region. The pixel structure of the organic light emitting diode display of the disclosure has a sensing function in addition to the display function, and at the same time the such arrangement enables the display to have a resolution of more than 500 ppi.

38 Claims, 17 Drawing Sheets

(56) References Cited

U.S. PATENT DOCUMENTS

| | | | | |
|---|---|---|---|---|
| 2008/0136794 A1* | 6/2008 | Ishikawa | ............. | G02F 1/13338 |
| | | | | 345/175 |
| 2009/0109172 A1* | 4/2009 | Lee | ......................... | G09G 3/344 |
| | | | | 345/107 |
| 2010/0315377 A1* | 12/2010 | Chang | ................... | G06F 3/0412 |
| | | | | 345/175 |
| 2012/0092238 A1* | 4/2012 | Hwang | ................ | G09G 3/3225 |
| | | | | 345/55 |
| 2014/0098184 A1* | 4/2014 | Hughes | ................ | G06F 3/0421 |
| | | | | 348/14.16 |
| 2015/0331508 A1* | 11/2015 | Nho | ........................ | G06F 3/042 |
| | | | | 345/173 |
| 2017/0278904 A1* | 9/2017 | Park | ................... | H01L 27/3218 |

\* cited by examiner

PIXEL STRUCTURE OF ORGANIC LIGHT EMITTING DIODE DISPLAY

CROSS REFERENCE TO RELATED APPLICATION

This application claims the priority benefit of U.S. Provisional Application Ser. No. 62/540,050, filed Aug. 1, 2017, and Chinese Patent Application Serial Number 201810642102.1, filed on Jun. 21, 2018, the full disclosure of which are incorporated herein by reference.

BACKGROUND

Technical Field

The present disclosure relates to the field of displays, and in particular, to a pixel structure of an organic light emitting diode display.

RELATED ART

At present, an organic light emitting diode display has been developed to be equipped with various functions. The multi-functions display has a plurality of sensing functions in addition to the original display function, such as a light sensing function, a pressure touch sensing function, a fingerprint sensing function, Infrared light sensing function, heartbeat sensing function, photometric sensing function, iris recognition function or eye tracking sensing function.

The sensing component may not be arranged in the pixel arrangement of the organic light emitting diode display in the prior art. It is required to arrange the sensing component at a region outside the pixel, which may increase the volume of the display. If the sensing components are integrated into the pixels, the configuration of the sensing components affects the arrangement of the plurality of the color sub-pixels in the pixels, which would affect the resolution of the organic light-emitting diode display.

The prior art may also configure the sensing component into the gap of the plurality of pixels of the pixel structure. However, the sensing component of the prior art is not arranged in the light emitting region. Such arrangement still affects the resolution and image quality of the organic light-emitting diode display and cannot meet the requirements of high resolution and high image quality.

SUMMARY

The disclosure is related to a pixel structure of an organic light emitting diode display to solve the problem of the affection on the resolution and image quality of the organic light-emitting diode display arising from integrating the sensing component into the pixel.

In one embodiment, a pixel structure of an organic light emitting diode display comprises a substrate and a plurality of pixels arranged on the substrate. The plurality of pixels is closely arranged. Each of the pixels is a light-emitting region. Each of the pixels comprises a plurality of sub-regions arranged in at least one column. Each sub-region of each of the column of the pixels comprises a color sub-pixel, a transparent sub-pixel or a sensing component. At least one of the pluralities of sub-regions of each pixel is the sensing component and the sensing component is arranged in the light-emitting region.

In the embodiments of the disclosure, the sensing component is integrated into the pixel structure of the display, and the sensing component is arranged in a light emitting region of the pixel of the pixel structure such that the pixel structure of the organic light emitting diode display has a sensing function in addition to the display function, and at the same time the such arrangement enables the display to have a resolution of more than 500 ppi.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DESCRIPTION OF THE EMBODIMENTS

Figure 1:
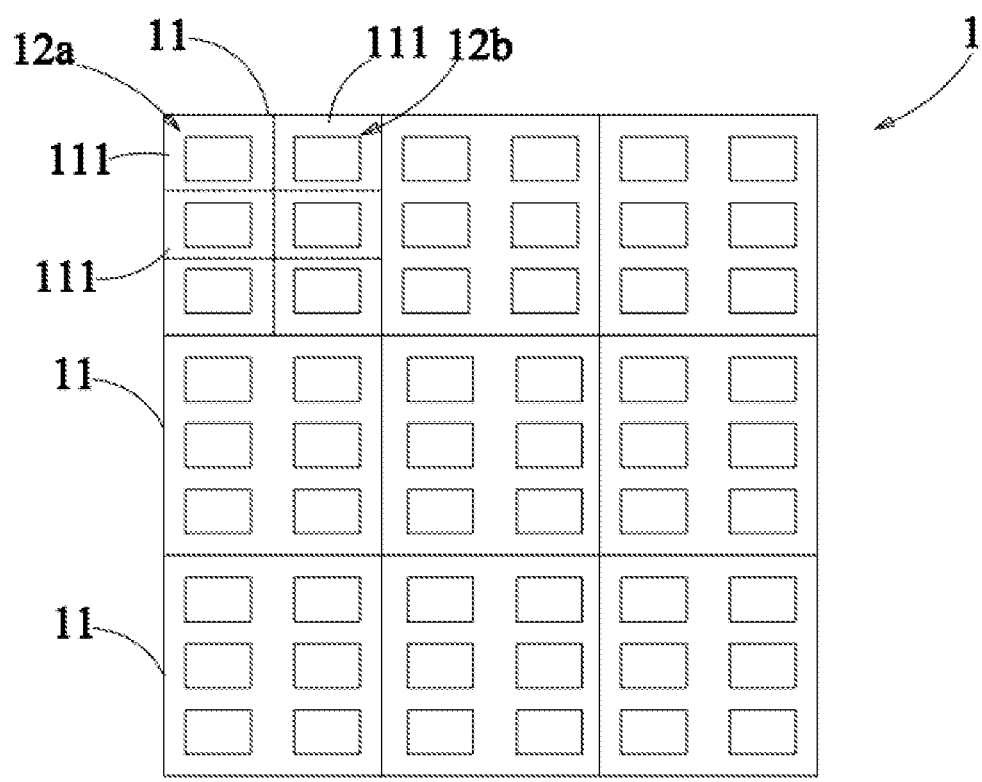
FIG. 1 is a schematic view showing the arrangement of the sub-region of the pixels of an organic light emitting diode display according to a first embodiment of the present disclosure.

The present disclosure will now be described more fully hereinafter with reference to the accompanying drawings, in which exemplary embodiments of the invention are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect. Additionally, the term "couple" or "connect" covers any direct or indirect electrically coupling means. Therefore, when one device is electrically connected to another device in the context, that connection may be through a direct electrical connection, or through an indirect electrical connection via other devices and connections. The following description is of the best-contemplated mode of carrying out the invention. This description is made for the purpose of illustration of the general principles of the invention and should not be taken in a limiting sense. The scope of the invention is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals is used to refer to the same or similar elements throughout the disclosure.

The present disclosure provides a pixel structure of an organic light emitting diode display. The pixel structure includes a substrate a plurality of pixels formed on the substrate. The plurality of pixels is arranged closely. Each of the pixels is a light-emitting region The disclosure provides a pixel structure of an organic light emitting diode display comprising a substrate and a plurality of pixels arranged on the substrate. The plurality of pixels is closely arranged. Each of the pixels is a light-emitting region. Each of the pixels comprises a plurality of sub-regions arranged in at least one column. The amount of the sub-regions in each pixel is the same. The amount of the sub-regions in each pixel is 4 to 6. The amount of the sub-regions in each column may be the same or different. Each sub-region of each column comprises a color sub-pixel, a transparent sub-pixel or a sensing component. At least one of the plurality of sub-regions of each pixel is the sensing component and the sensing component is arranged in the light-emitting region. The color sub-pixel is a red sub-pixel, a green sub-pixel or a blue sub-pixel. The sensing component may be a light sensing component, pressure touch sensing component, fingerprint sensing component, infrared light sensing component, heartbeat sensing component, photometric sensing component, iris identification components or eye tracking sensing component. It is noted that the selection of sensing component is not limited to the above enumeration. The shape of the color sub-pixel, the transparent sub-pixel or the sensing component may be triangle, square, rectangle, rhombic, pentagon, hexagon, polygon, circle, or ellipse. A suitable shape can be selected in accordance with the actual functional requirements of the organic light emitting diode display. The shape of the color sub-pixel, the transparent sub-pixel or the sensing component respectively refers to the shape of the color sub-pixel, the transparent sub-pixel or the sensing component that actually functions. The disclosure integrates the color sub-pixel, the transparent sub-pixel and the sensing component into the same pixel such that the pixel structure of the organic light emitting diode display has a sensing function in addition to the display function, and at the same time the such arrangement enables the display to have a resolution of more than 500 ppi.

Various embodiments are provided to explain in details for the arrangement of the sub-regions of each pixel are arranged.

Refer to FIG. 1, which is a schematic view showing the arrangement of the sub-region of the pixels of an organic light emitting diode display according to a first embodiment of the present disclosure. As shown in the figure, each pixel 11 of the pixel stricture 1 of the organic light emitting diode display in this embodiment includes six sub-regions. The six sub-regions 111 are divided into a first column 12a and a second column 12b arranged at the right side of the first column. The number of the sub-regions 111 of the first column 12a is the same as the number of the sub-regions 111 of the second column 12b. The number of the sub-regions 111 of the first column 12a is three. The number of the sub-regions 111 of the second column 12b is three. The plurality of the sub-regions 111 of the first column 12a correspond to the plurality of the sub-regions 111 of the second column 12b. In this embodiment, each sub-region 111 includes a color sub-pixel, a transparent sub-pixel or a sensing component. The shape of the color sub-pixel, the transparent sub-pixel or the sensing component is a rectangular. The color sub-pixel, the transparent sub-pixel or the sensing component in each sub-region 111 has the same area. In other words, the plurality of the sub-regions 111 of the first column 12a are symmetrically arranged with the plurality of the sub-regions 111 of the second column 12b. The above is merely one embodiment of the present disclosure. If each pixel 11 includes an even number of the sub-regions 111, such as four sub-regions 111, the sub-regions 111 may be equally arranged in the first column 12a and the second column 12b, such that the number of the sub-regions 111 of the first column 12a is equal to the sub-regions 111 of the second column 12b, and the number of the plurality of the sub-regions 111 of the first column 12a correspond to the plurality of sub-regions 111 of the second column 12b, respectively.

Figure 2:
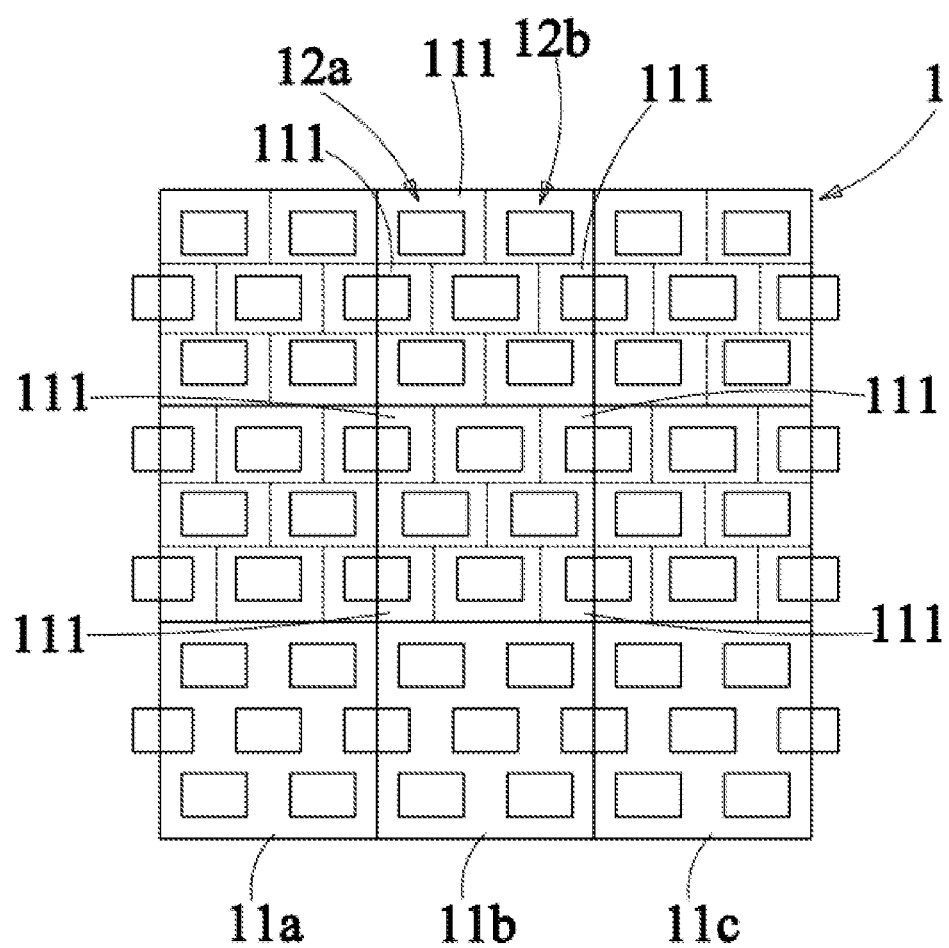
FIG. 2 is a schematic view showing the arrangement of the sub-region of the pixels of an organic light emitting diode display according to a second embodiment of the present disclosure.

Refer to FIG. 2, which is a schematic view showing the arrangement of the sub-region of the pixels of an organic light emitting diode display according to a second embodiment of the present disclosure. As shown in the figure, the difference between the pixel structure 1 of the organic light emitting diode display in this embodiment and the pixel structure of the organic light emitting diode display of the first embodiment lies in that the two sub-regions 111 in the second row are shifted left in relative to the sub-regions 111 in the first row and the third row such that the color sub-pixel, the transparent sub-pixel or the sensing component of the second sub-region 111 in the first column 12a may cross the adjacent pixel. Each row in this embodiment includes three pixels, referring as a first pixel 11a, a second pixel 11b and a third pixel 11c. The second sub-region 111 of the first column 12a of the second pixel 11b at the first row is shifted left and crosses to the first pixel 11a at the first row. The second sub-region 111 of the first column 12a of the third pixel 11c at the first row is shifted left and crosses to the second pixel 11b at the first row. The summation of the area, which is in the second pixel 11b, of the color sub-pixel, the transparent sub-pixel or the sensing component at the second sub-region 111 of the first column 12a of the second pixel 11b at the first row, and the area, which is in the second pixel 11b, of the color sub-pixel, the transparent sub-pixel or the sensing component at the second sub-region 111 of the first column 12a of the third pixel 11c at first row equals to the area of the sub-region 111 not crossing the adjacent pixels, which is in the second pixel 11b of the first row, of the color sub-pixel, the transparent sub-pixel or the sensing component. By way of such configuration, each pixel may have six sub-regions 111. The arrangement of the sub-regions 111 of each pixel at the third row is the same as the arrangement of the sub-regions 111 of each pixel at the first row.

In this embodiment, the first sub-region 111 and the third sub-region 111 at the first column 12a in each pixel at the second row are shifted right relative to the second sub-region 111 and cross to the adjacent pixels. For example, the first sub-region 111 and the third sub-region 111 at the first column 12a of the second pixel 11b at the second row, and the first sub-region 111 and the third sub-region 111 at the first column 12a of the third pixel 11c at the second row are shifted right and respectively cross to the first pixel 11a and the second pixel 11b at the second row. The summation of the area, which is in the second pixel 11b at the second row, of the color sub-pixel, the transparent sub-pixel or the sensing component of the first sub-region 111 and the third sub-region 111 of the first column 12a of the second pixel 11b at the second row, and the area, which is in the second pixel 11b, of the color sub-pixel, the transparent sub-pixel or the sensing component of the first sub-region 111 and the third sub-region 111 of the first column 12a of the third pixel 11c at the second row equals to the area of the color sub-pixel, the transparent sub-pixel or the sensing component of the sub-regions 111 that do not cross to the adjacent region of the second pixel 11b at the second row. By way of such configuration, each pixel 11b may have six sub-regions 111. From the above description, a plurality of sub-regions 111 in the plurality of pixels cross the two adjacent pixels. The summation of the areas at the same pixel of the color sub-pixel, the transparent sub-pixel or the sensing component in the two sub-regions 111 crossing adjacent pixels in each pixel equals to the area of the color sub-pixel, the transparent sub-pixel or the sensing component in the sub-region 111 of the pixel, thereby forming six sub-regions 111 in a pixel.

Figure 3:
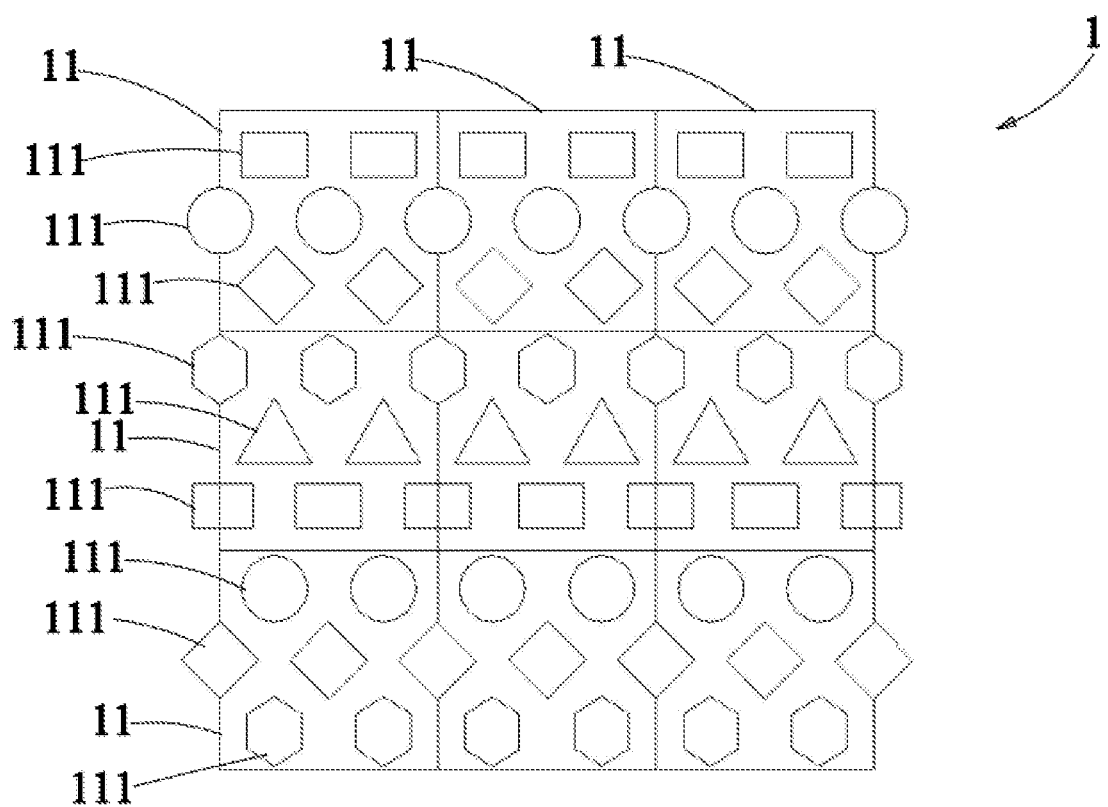
FIG. 3 is a schematic view showing the arrangement of the sub-region of the pixels of an organic light emitting diode display according to a third embodiment of the present disclosure.

Refer to FIG. 3, which is a schematic view showing the arrangement of the sub-region of the pixels of an organic light emitting diode display according to a third embodiment of the present disclosure. As shown in the figure, the difference between the pixel structure 1 of the organic light emitting diode display in this embodiment and the pixel structure of the organic light emitting diode display of the second embodiment lies in that the arrangement of the sub-region 111 in each pixel 11 of this embodiment is the same as the arrangement of each pixel in the second embodiment. The shape of the color sub-pixel, the transparent sub-pixel or the sensing component in the sub-region 111 of each row of each pixel 11 is different. For example, the shapes of the color sub-pixels, the transparent sub-pixels or the sensing components in the plurality of sub-regions 111 at the first row in each pixel 11 of the first row are rectangular. The shapes of the color sub-pixels, the transparent sub-pixels or the sensing components in the plurality of sub-regions 111 at the second row in each pixel 11 of the first row are circular. The shapes of the color sub-pixels, the transparent sub-pixels or the sensing components in the plurality of sub-regions 111 at the third row in each pixel 11 of the first row are rhombic.

In this embodiment, the shape arrangement of the color sub-pixel, the transparent sub-pixel or the sensing component in the plurality of sub-regions 111 in each pixel is different. For example, the shapes of the color sub-pixels, the transparent sub-pixels or the sensing components in the plurality of sub-regions 111 arranged at the first row in the second pixel 11 of the first column are hexagon. The shapes of the color sub-pixels, the transparent sub-pixels or the sensing components in the sub-regions 111 arranged at the second row in the second pixel 11 of the first column are triangle. The shapes of the color sub-pixels, the transparent sub-pixels or the sensing components in the sub-regions 111 arranged at the third row in the second pixel 11 of the first column are rectangular. By way of such configuration, the shapes of the color sub-pixels, the transparent sub-pixels or the sensing components in the sub-regions 111 arranged at the third row in the second pixel 11 of the first column different from the shapes of the color sub-pixels, the transparent sub-pixels or the sensing components in the sub-regions 111 arranged at the third row in the first pixel 11 of the first column.

From the above description, the shapes of the color sub-pixels, the transparent sub-pixels or the sensing components in the sub-regions 111 of each row of each pixel are the same. The shapes of the color sub-pixels, the transparent sub-pixels or the sensing components in sub-regions 111 of each pixel in each column are different.

Figure 4:
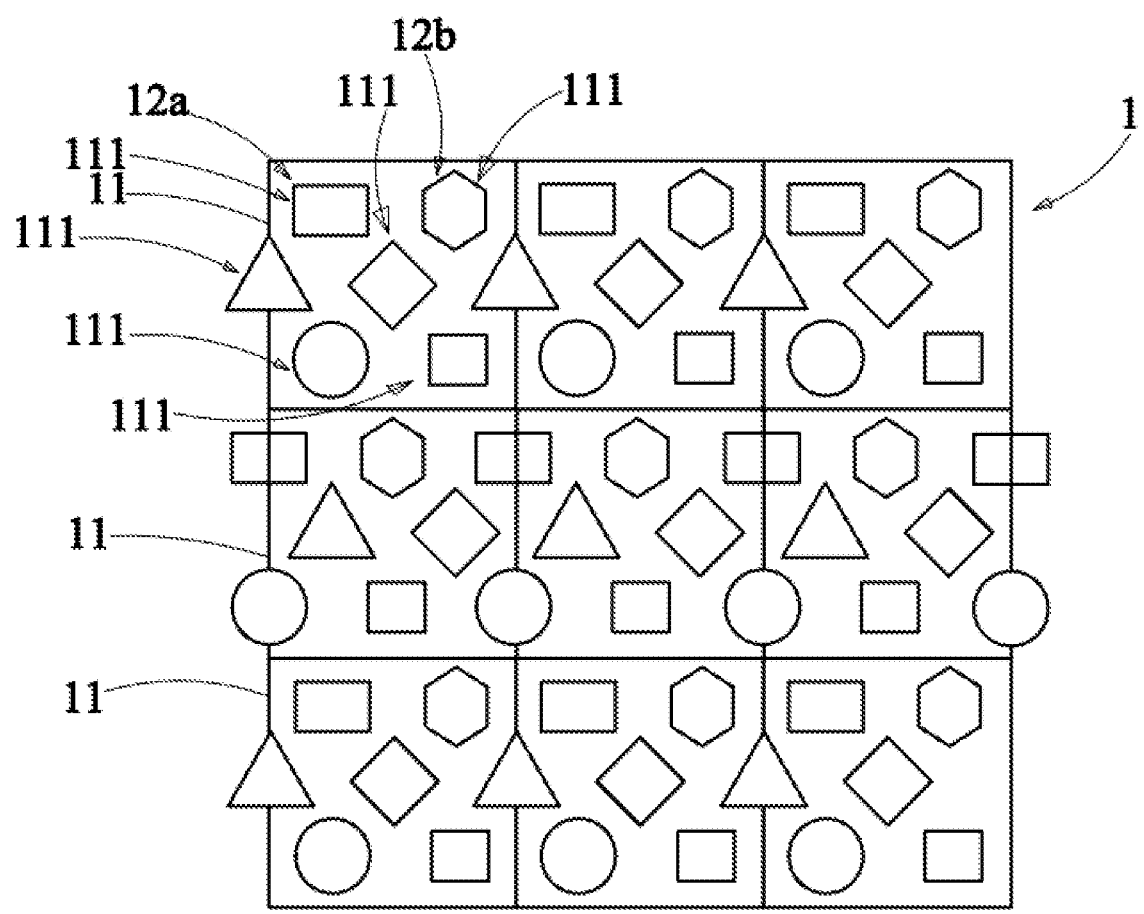
FIG. 4 is a schematic view showing the arrangement of the sub-region of the pixels of an organic light emitting diode display according to a fourth embodiment of the present disclosure.

Refer to FIG. 4, which is a schematic view showing the arrangement of the sub-region of the pixels of an organic light emitting diode display according to a fourth embodiment of the present disclosure. As shown in the figure, the difference between the pixel structure 1 of the organic light emitting diode display in this embodiment and the pixel structure of the organic light emitting diode display of the third embodiment lies in that the arrangement of the sub-regions of each pixel 11 in this embodiment is the same as the arrangement of the sub-regions of each pixel in the second embodiment. The shape arrangement of the color sub-pixels, the transparent sub-pixels or the sensing components in the plurality of sub-regions 111 of each pixel 11 is the same. The shapes of the color sub-pixels, the transparent sub-pixels or the sensing components in the plurality of sub-regions 111 of the same pixel are different. In this embodiment, the shape of the color sub-pixel, the transparent sub-pixel or the sensing component in the first sub-region 111 of the first column 12a is rectangular. The shape the color sub-pixel, the transparent sub-pixel or the sensing component in the second sub-region 111 of the first column 12a is triangular. The shape the color sub-pixel, the transparent sub-pixel or the sensing component in the third sub-region 111 of the first column 12a is circle. The shape the color sub-pixel, the transparent sub-pixel or the sensing component in the first sub-region 111 of the second column 12b is hexagon. The shape the color sub-pixel, the transparent sub-pixel or the sensing component in the second sub-region 111 of the second column 12b is rhombic. The shape the color sub-pixel, the transparent sub-pixel or the sensing component in the third sub-region 111 of the second column 12b is square. In this embodiment, the arrangement of the sub-region 111 in the pixels at the first row and the third row is the same as the arrangement of the sub-region in the pixels at the first row and the third row in the second embodiment. The arrangement of the sub-region 111 in the pixels at the second rows the same as the arrangement of the sub-region in the pixels at the second row in the second embodiment. The detailed description thereof is not rendered again.

Figure 5:
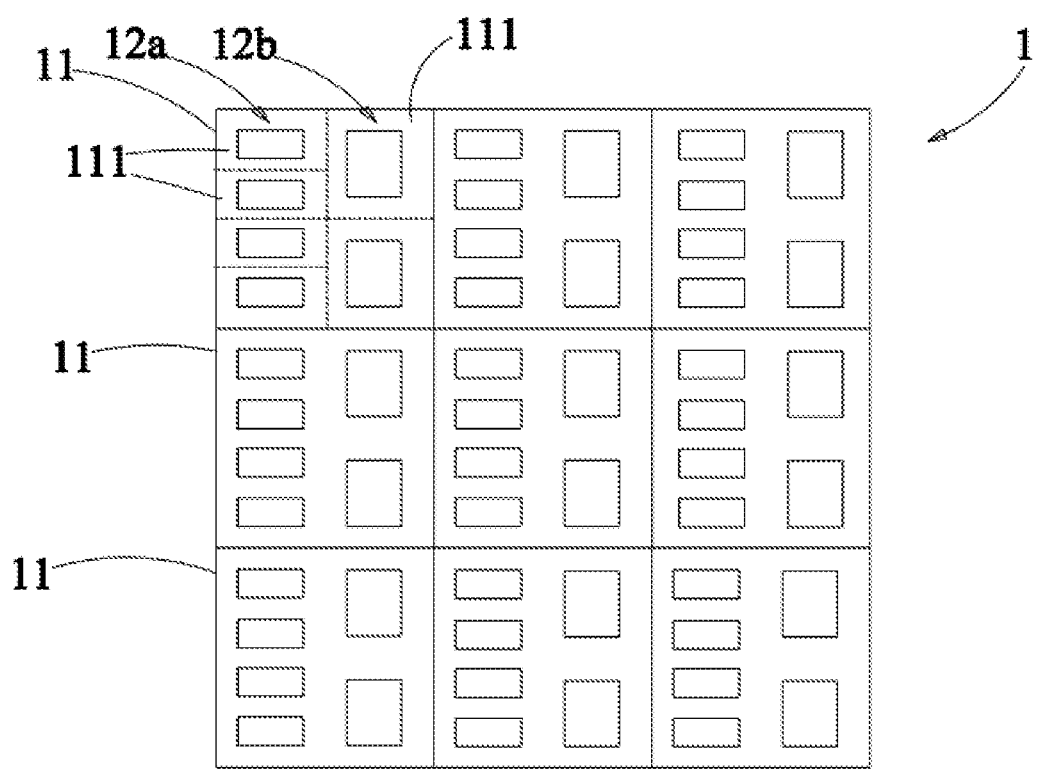
FIG. 5 is a schematic view showing the arrangement of the sub-region of the pixels of an organic light emitting diode display according to a fifth embodiment of the present disclosure.

Refer to FIG. 5, which is a schematic view showing the arrangement of the sub-region of the pixels of an organic light emitting diode display according to a fifth embodiment of the present disclosure. As shown in the figure, the difference between the pixel structure 1 of the organic light emitting diode display in this embodiment and the pixel structure of the organic light emitting diode display of the first embodiment lies in that the amount of the sub-regions 111 in the first column 12a of each pixel 11 is greater than the amount of the sub-regions 111 in the second column 12b. The amount of the sub-regions 111 in the first column 12a is M. The amount of the sub-regions 111 in the second column 12b is N. The summation of M and N is 5 to 6. When N is 2, M is N+1 or N+2. In this embodiment, the summation of M and N is 6. The amount (M) of the sub-regions 111 in the first column 12a of each pixel is 4. The amount (N) of the sub-regions 111 in the second column 12b of each pixel is 2. Each sub-region 111 of the second column 12b correspond to the two adjacent sub-regions 111 of the first column 12a. In this embodiment, each sub-region 111 includes a color sub-pixel, a transparent sub-pixel or a sensing component, the shape of which are all rectangular. The arrangement of the plurality of the sub-regions 111 of each pixel is the same. When the amount (N+M) of the sub-regions 111 of each pixel 11 is 5, the amount (N) of the sub-regions 111 of the second column 12b in each pixel 11 remains as 2, while the amount (M) of the sub-regions 111 of the first column 12a in each pixel 11 is 3.

Figure 6:
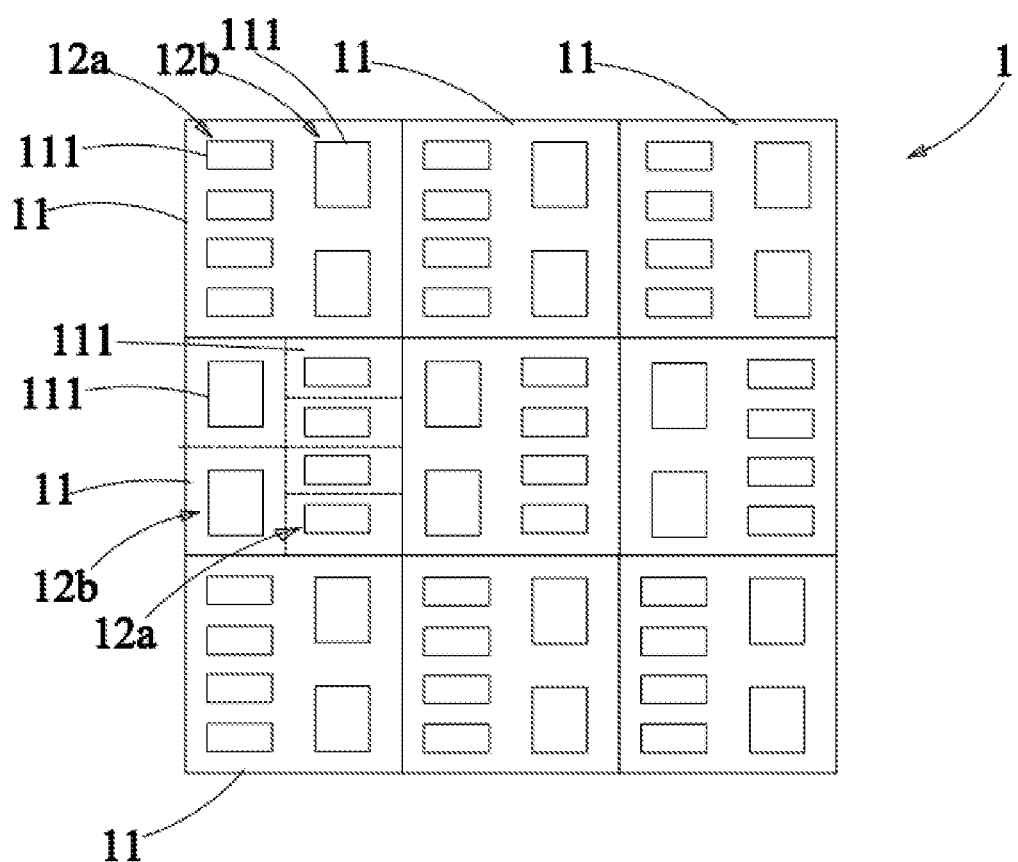
FIG. 6 is a schematic view showing the arrangement of the sub-region of the pixels of an organic light emitting diode display according to a sixth embodiment of the present disclosure.

Refer to FIG. 6, which is a schematic view showing the arrangement of the sub-region of the pixels of an organic light emitting diode display according to a sixth embodiment of the present disclosure. As shown in the figure, the difference between the pixel structure 1 of the organic light emitting diode display in this embodiment and the pixel structure of the organic light emitting diode display of the fifth embodiment lies in that the arrangement of the plurality of the sub-regions of each pixel is the same. The organic light emitting diode display in this embodiment includes a plurality of pixels 11 arranged in a plurality of columns. The arrangement of the plurality of sub-regions 111 of the plurality of pixels 11 in each column is different from the arrangement of the plurality of the sub-regions 111 of the plurality of the adjacent pixels 11. In this embodiment, the arrangement of the six sub-regions 111 of the pixels 11 at the first row and the third row is the same as the arrangement of the six sub-regions of each pixel in the fifth embodiment. The arrangement of the six sub-regions 111 of the pixels at the second row is contrary to the arrangement of the six sub-regions 111 of the pixels 11 at the first row and the third row. In other words, the second column 12b of the pixel 11 at the second row is arranged at the left side of the first column 12a, that is the first column 12a and the second column 12b are reversely arranged. Each sub-region 111 of the first column 12a corresponds to the two adjacent sub-regions 111 of the second column 12b.

Figure 7:
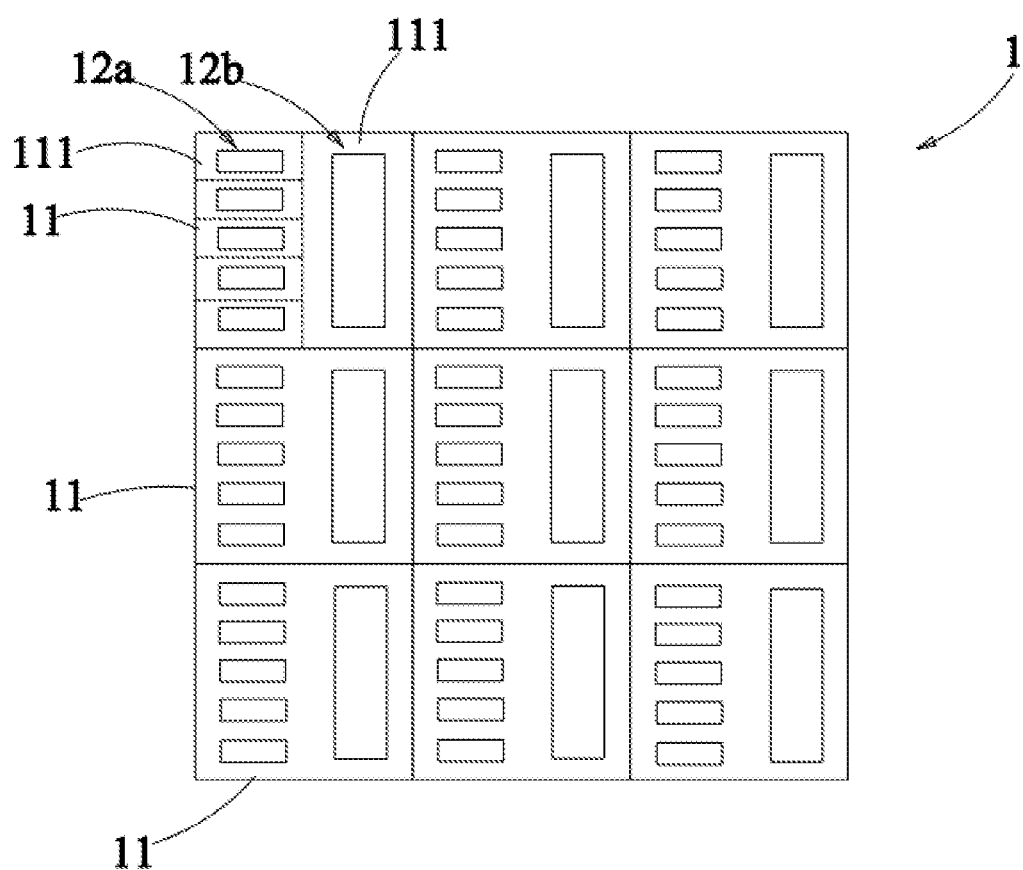
FIG. 7 is a schematic view showing the arrangement of the sub-region of the pixels of an organic light emitting diode display according to a seventh embodiment of the present disclosure.

Refer to FIG. 7, which is a schematic view showing the arrangement of the sub-region of the pixels of an organic light emitting diode display according to a seventh embodiment of the present disclosure. As shown in the figure, the difference between the pixel structure 1 of the organic light emitting diode display in this embodiment and the pixel structure of the organic light emitting diode display of the fifth embodiment lies in that the amount of the sub-regions 111 in the first column 12a of each pixel 11 is greater than the amount of the sub-regions 111 in the second column 12b. The amount of the sub-regions 111 in the first column 12a is M. The amount of the sub-regions 111 in the second column 12b is N. The summation of M and N is 4 to 6. When N is 1, M is N+2, N+3 or N+4. In this embodiment, the summation of M and N is 6. The amount (M) of the sub-regions 111 in the first column 12a of each pixel 11 is 5. The amount (N) of the sub-regions 111 in the second column 12b is 1. Each sub-region 111 of the second column 12b corresponds to the five adjacent sub-regions 111 of the first column 12a. In this embodiment, each sub-region 111 includes a color sub-pixel, a transparent sub-pixel or a sensing component. The shape of the color sub-pixel, the transparent sub-pixel or the sensing component is rectangular. The arrangement of the sub-regions 111 in the pixels 11 of the second row in this embodiment may be contrary to the arrangement of the sub-regions 111 in the pixels 11 of the first row and the third row, similar with the sixth embodiment. When the amount (M+N) of the sub-regions 111 in each pixel 11 is 4 or 5, the amount (N) of the sub-region 111 in the second column 12b in each pixel 11 is 1, and the amount (M) of the sub-regions 111 in the first column 12a in each pixel 11 is 3 or 4. Certainly, the arrangement of the sub-regions 111 in the pixels 11 at the second row may be contrary to the arraignment of the sub-regions 111 in the pixels 11 at the first row and the third row, similar with the sixth embodiment.

Figure 8:
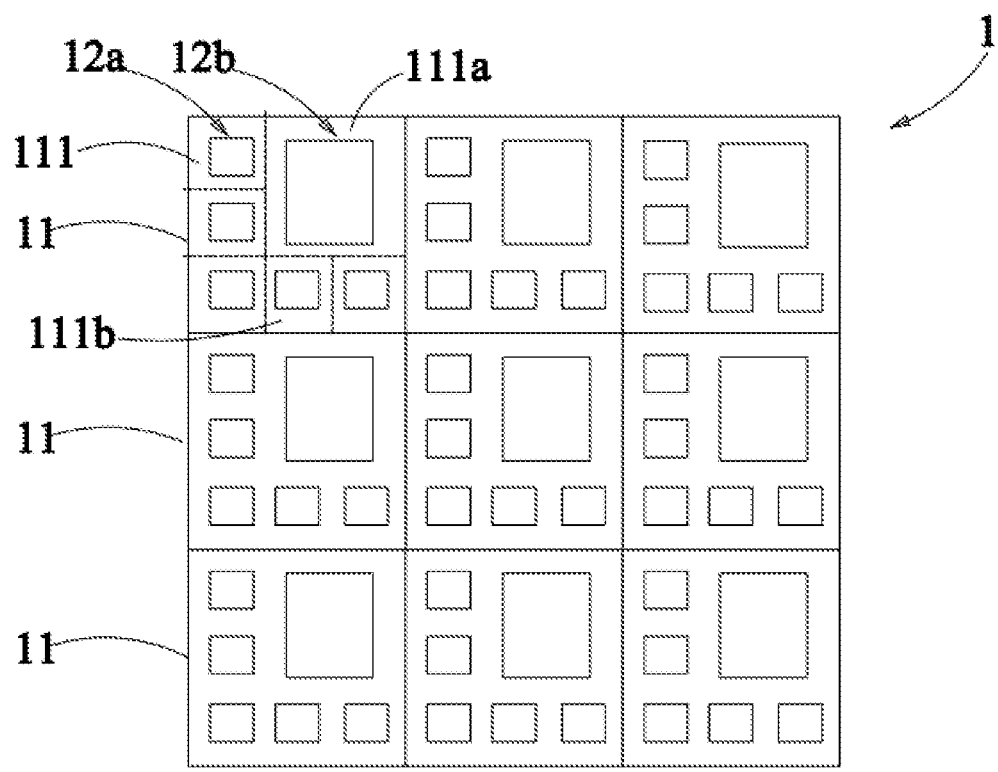
FIG. 8 is a schematic view showing the arrangement of the sub-region of the pixels of an organic light emitting diode display according to an eighth embodiment of the present disclosure.

Refer to FIG. 8, which is a schematic view showing the arrangement of the sub-region of the pixels of an organic light emitting diode display according to an eighth embodiment of the present disclosure. As shown in the figure, each pixel 11 of the pixel structure 1 of the organic light emitting diode display in this embodiment includes sixth sub-regions 111. The six sub-regions 111 are divided into a first column 12a and the second columns 12b right to the first column. The amount of the sub-regions 111 of the first column 12a is 3. The amount of the sub-regions 111 of the second columns 12b is 3, which are divided into a first sub-region 111a and two second sub-regions 111b. The first sub-region 111a is arranged above to the two second sub-regions 111b. The two second sub-regions 111b are arranged side by side horizontally. The first sub-region 111a corresponds to the two adjacent sub-regions 111 in the first column 12a. The two second sub-regions 111b correspond to one sub-region 111 in the first column 12a. In this embodiment, each of the sub-regions 111, the first sub-region 111a, and the two second sub-regions 111b include a color sub-pixel, a transparent sub-pixel or a sensing component. The shape of the color sub-pixel, the transparent sub-pixel or the sensing component is rectangular. Certainly, the arrangement of the sub-regions 111 in the pixels 11 at the second row may be contrary to the arraignment of the sub-regions 111 in the pixels 11 at the first row and the third row, similar with the sixth embodiment.

Figure 9:
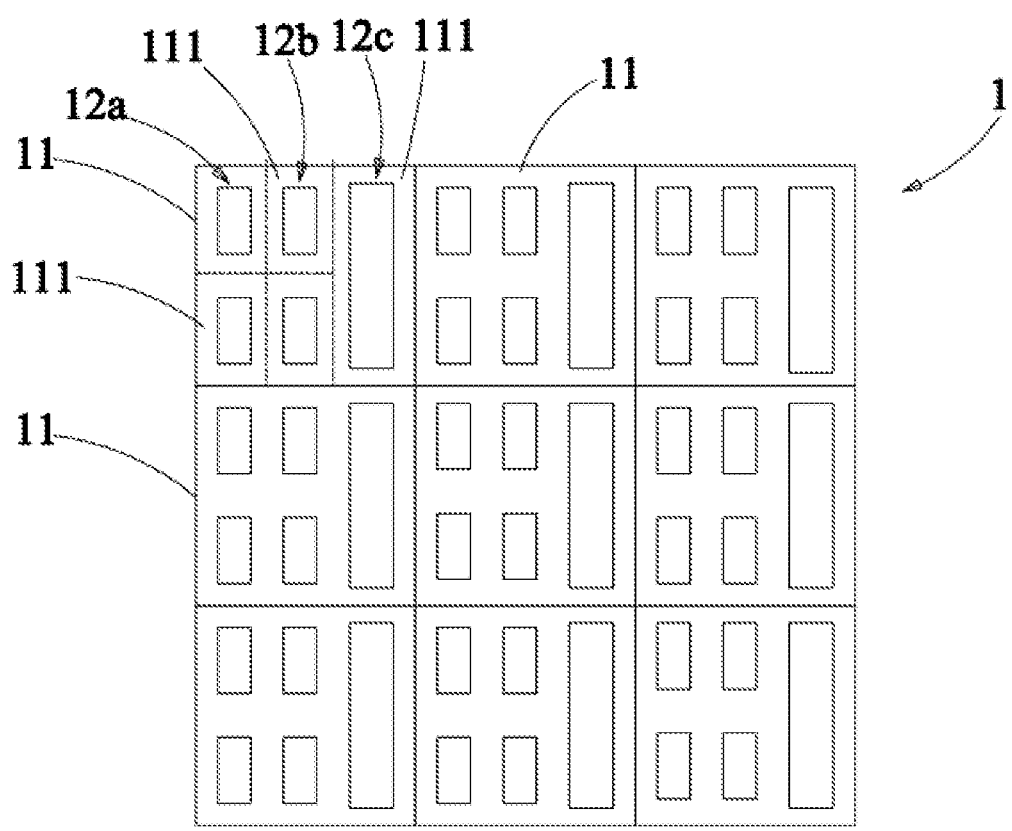
FIG. 9 is a schematic view showing the arrangement of the sub-region of the pixels of an organic light emitting diode display according to a ninth embodiment of the present disclosure.

Refer to FIG. 9, which is a schematic view showing the arrangement of the sub-region of the pixels of an organic light emitting diode display according to a ninth embodiment of the present disclosure. As shown in the figure, the six sub-regions 111 of the organic light emitting diode display 1 are divided into three columns, referred as the first column 12a, the second column 12b and the third column 12c. The second column 12b is arranged between the first column 12a and the third column 12c. The amount of the sub-regions 111 of the first column 12a is M1. The amount of the sub-regions 111 of the second column 12b is M2. The amount of the sub-regions 111 of the third column 12c is M3. The summation of M1, M2, and M3 is 5. M1 equals to M2. M1 is greater than M3. M2 is greater than M3. In this embodiment, the amount (M1) of the sub-regions 111 of the first column 12a is 2, the amount (M2) of the sub-regions 111 of the second column 12b is 2, and the amount (M3) of the sub-regions 111 of the third column 12c is 1. In this embodiment, the third column 12c is arranged at the right side of the first column 12a. Certainly the first column 12a and the third column 12c may be reversely arranged, that is the third column 12c is arranged at the left side of the first column 12a. Certainly, the arrangement of the sub-regions 111 in the pixels 11 at the second row may be contrary to the arraignment of the sub-regions 111 in the pixels 11 at the first row and the third row, similar with the sixth embodiment.

Figure 10:
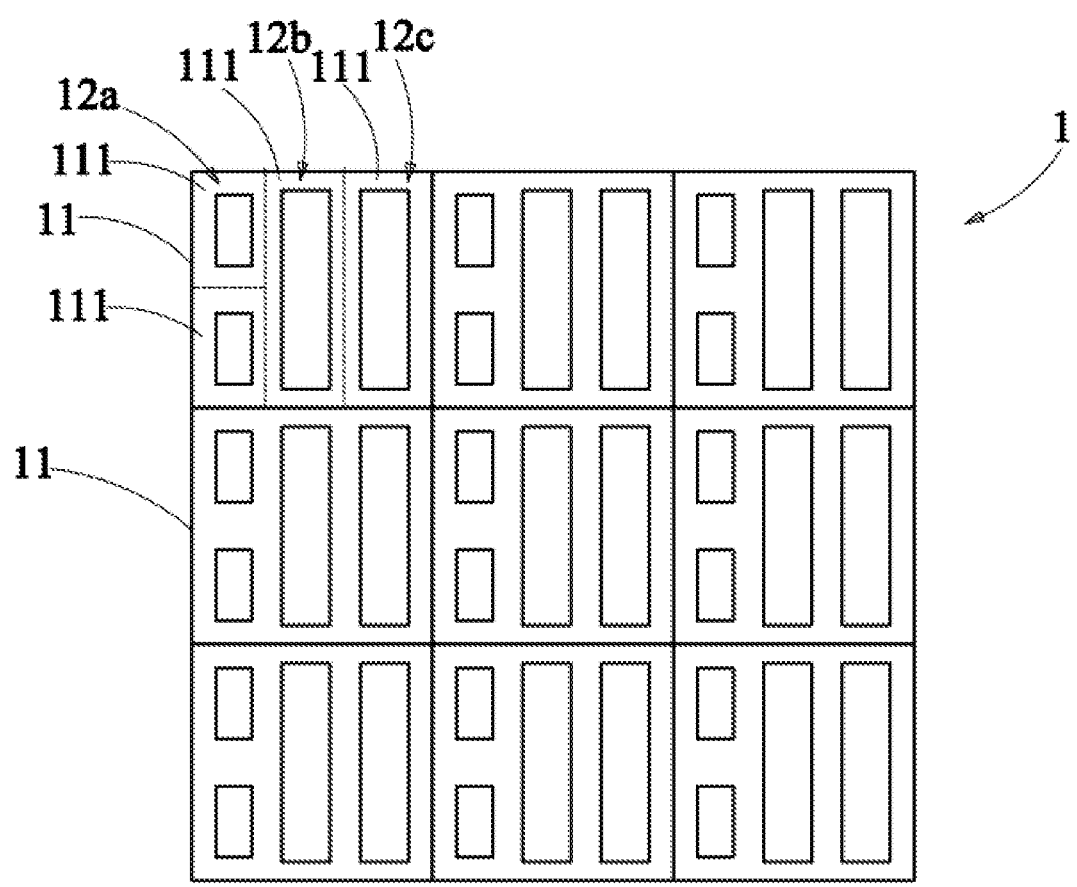
FIG. 10 is a schematic view showing the arrangement of the sub-region of the pixels of an organic light emitting diode display according to a tenth embodiment of the present disclosure.

Refer to FIG. 10, which is a schematic view showing the arrangement of the sub-region of the pixels of an organic light emitting diode display according to a tenth embodiment of the present disclosure. As shown in the figure, the difference between this embodiment and the above embodiment lies in the summation of M1, M2 and M3 in this embodiment is 4 to 6. M1 is greater than M2 and M3. M2 equals to M3. In this embodiment, the summation of M1, M2 and M3 is 4. The amount (M1) of the sub-regions 111 of the first column 12a is 2, the amount (M2) of the sub-regions 111 of the second column 12b is 1, and the amount (M3) of the sub-regions 111 of the third column 12c is 1. When the summation of M1, M2 and M3 is 5, the amount (M1) of the sub-regions 111 of the first column 12a is 3. When the summation of M1, M2 and M3 is 6, the amount (M1) of the sub-regions 111 of the first column 12a is 4. In this embodiment, the third column 12c is arranged at the right side of the first column 12a. Certainly the first column 12a and the third column 12c may be reversely arranged, that is the third column 12c is arranged at the left side of the first column 12a. Certainly, the arrangement of the sub-regions 111 in the pixels 11 at the second row may be contrary to the arraignment of the sub-regions 111 in the pixels 11 at the first row and the third row, similar with the sixth embodiment.

Figure 11:
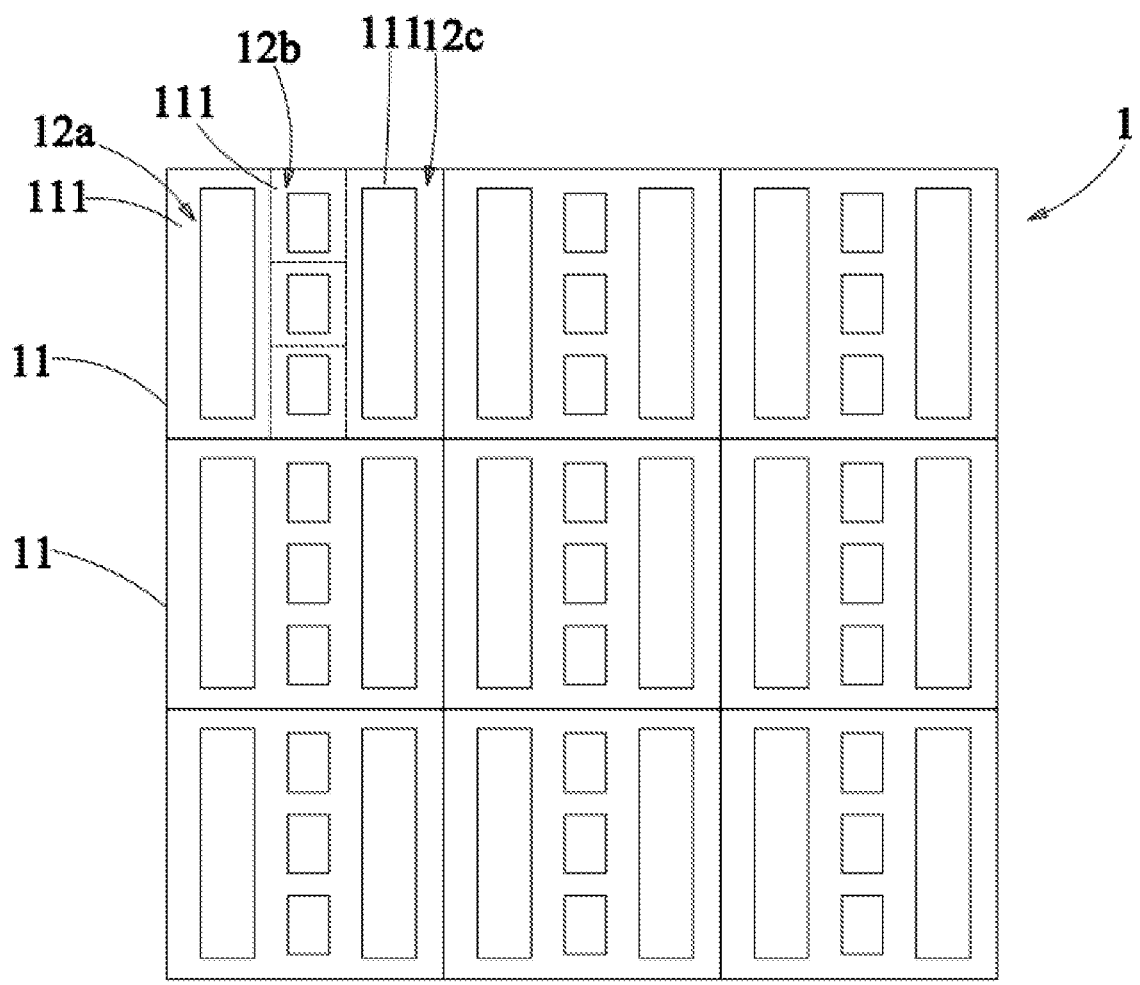
FIG. 11 is a schematic view showing the arrangement of the sub-region of the pixels of an organic light emitting diode display according to an eleventh embodiment of the present disclosure.

Refer to FIG. 11, which is a schematic view showing the arrangement of the sub-region of the pixels of an organic light emitting diode display according to an eleventh embodiment of the present disclosure. As shown in the figure, the difference between this embodiment and the tenth embodiment lies in the summation of M1, M2 and M3 in this embodiment is 4 to 6. M2 is greater than M1 and M3. M1 equals M3. In this embodiment, the summation of M1, M2 and M3 is 5. The amount (M1) of the sub-regions 111 of the first column 12a is 1, the amount (M2) of the sub-regions 111 of the second column 12b is 3, and the amount (M3) of the sub-regions 111 of the third column 12c is 1. When the summation of M1, M2 and M3 is 4, the amount (M2) of the sub-regions 111 of the second column 12b is 2. When the summation of M1, M2 and M3 is 6, the amount (M2) of the sub-regions 111 of the second column 12b is 4.

Figure 12:
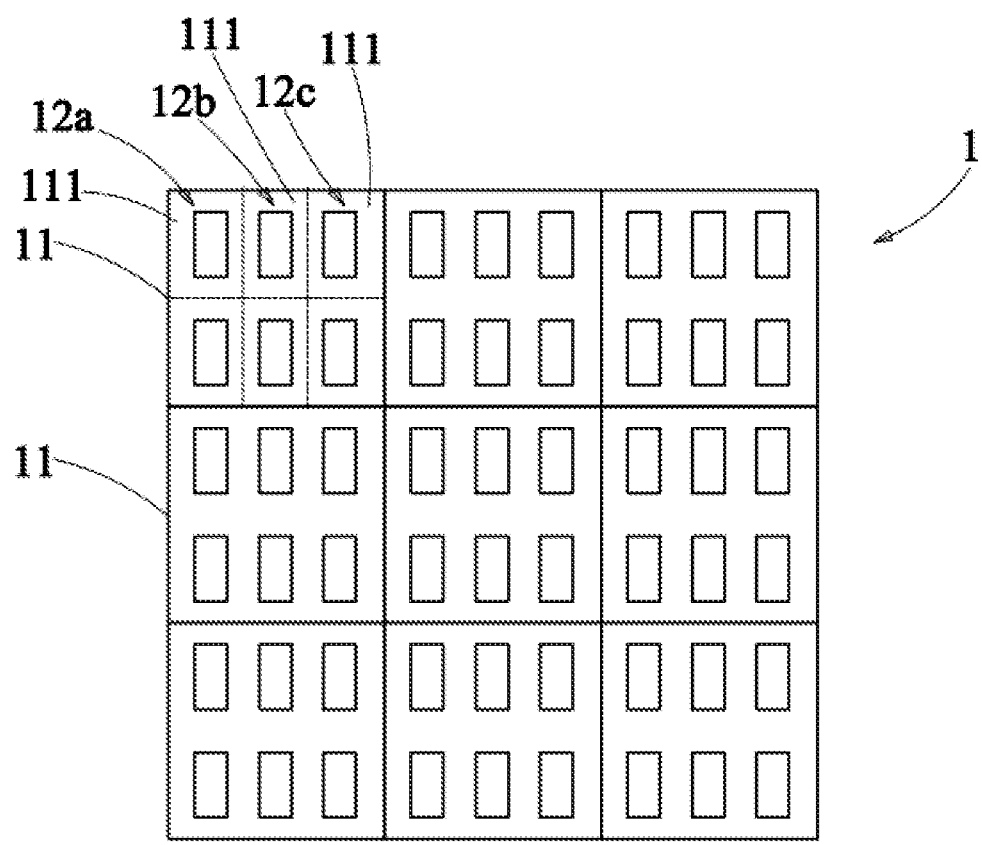
FIG. 12 is a schematic view showing the arrangement of the sub-region of the pixels of an organic light emitting diode display according to a twelfth embodiment of the present disclosure.

Refer to FIG. 12, which is a schematic view showing the arrangement of the sub-region of the pixels of an organic light emitting diode display according to a twelfth embodiment of the present disclosure. As shown in the figure, the difference between this embodiment and the tenth embodiment lies in the summation of M1, M2 and M3 in this embodiment is 6. M1, M2, and M3 are equivalent. In this embodiment, the amount (M1) of the sub-regions 111 of the first column 12a, the amount (M2) of the sub-regions 111 of the second column 12b, and the amount (M3) of the sub-regions 111 of the third column 12c is 2 respectively.

Figure 13:
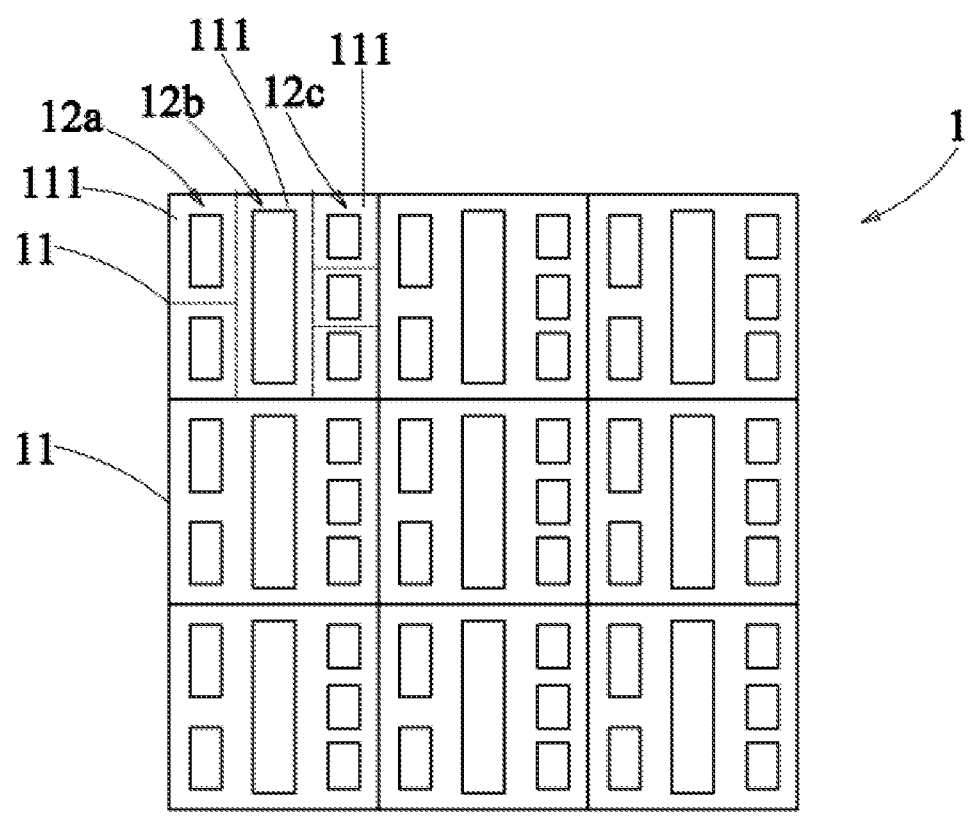
FIG. 13 is a schematic view showing the arrangement of the sub-region of the pixels of an organic light emitting diode display according to a thirteenth embodiment of the present disclosure.

Refer to FIG. 13, which is a schematic view showing the arrangement of the sub-region of the pixels of an organic light emitting diode display according to a thirteenth embodiment of the present disclosure. As shown in the figure, the difference between this embodiment and the tenth embodiment lies in the summation of M1, M2 and M3 in this embodiment is 6. M1, M2, and M3 are inequivalent. In this embodiment, the amount (M1) of the sub-regions 111 of the first column 12a is 2, the amount (M2) of the sub-regions 111 of the second column 12b is 1, and the amount (M3) of the sub-regions 111 of the third column 12c is 3. The sequence of these three columns may be arbitrarily arranged, which is not limited to the above arrangement.

Figure 14:
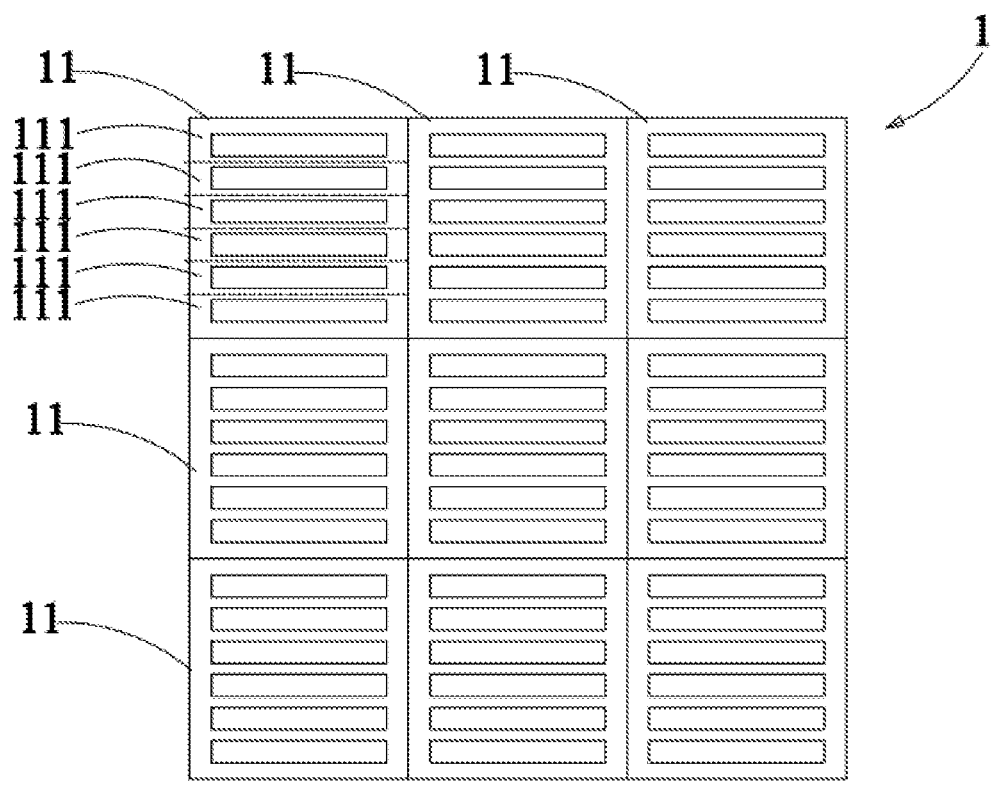
FIG. 14 is a schematic view showing the arrangement of the sub-region of the pixels of an organic light emitting diode display according to a fourteenth embodiment of the present disclosure.

Refer to FIG. 14, which is a schematic view showing the arrangement of the sub-region of the pixels of an organic light emitting diode display according to a fourteenth embodiment of the present disclosure. As shown in the figure, the plurality of the sub-regions 111 in each pixel 11 of the pixel structure of the organic light emitting diode display according to this embodiment is arranged in one column. The amount of the sub-regions 111 in each pixel 11 according to this embodiment is 6. Certainly, the amount of the sub-regions 111 in each pixel 11 may be 4 or 5. The description is not rendered again.

Figure 15:
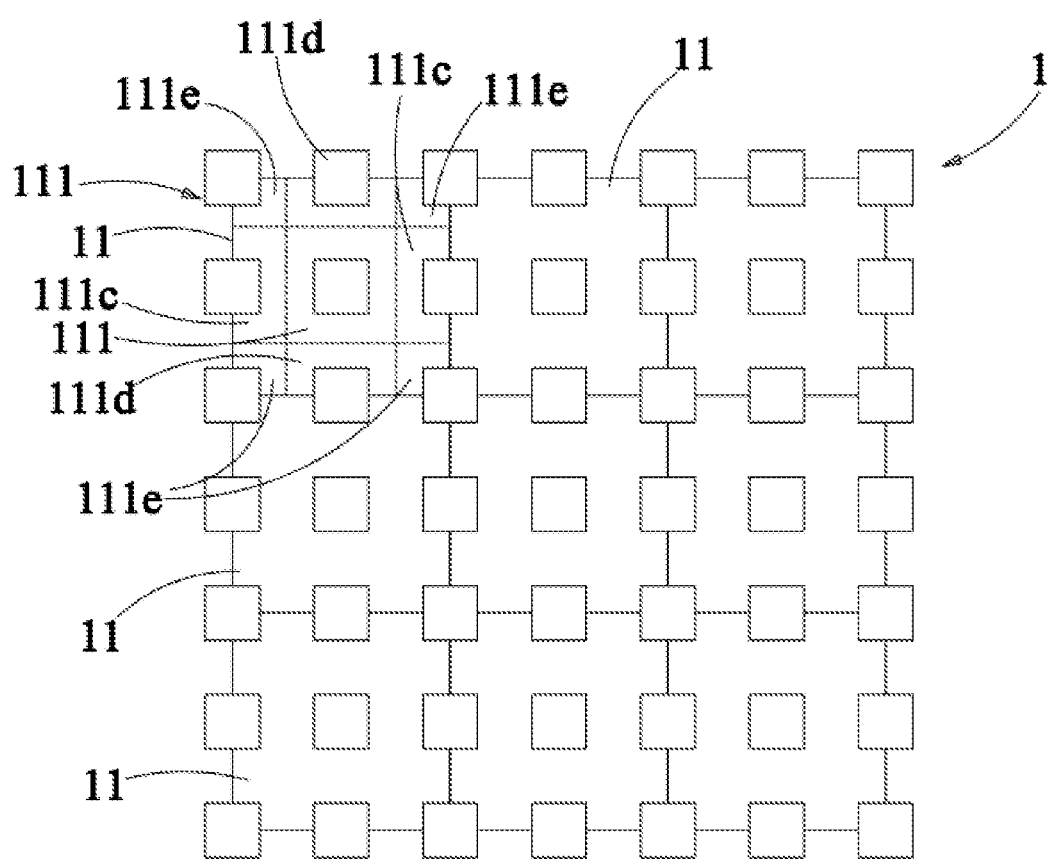
FIG. 15 is a schematic view showing the arrangement of the sub-region of the pixels of an organic light emitting diode display according to a fifteenth embodiment of the present disclosure.

Refer to FIG. 15, which is a schematic view showing the arrangement of the sub-region of the pixels of an organic light emitting diode display according to a fifteenth embodiment of the present disclosure. As shown in the figure, each pixel 11 of the pixel structure 1 of the organic light emitting diode display in this embodiment includes four sub-regions 111. The four sub-regions include one complete sub-region 111 in the center of the pixel 11. The other three sub-regions 111 are shared with the adjacent with the other pixels 11. In this embodiment, the third sub-regions 111c, 111d are respectively arranged at the right, left, top and the bottom side of the sub-region 111. The sub-regions 111c, 111d cross two pixels 11. The summation of the area, which is in the same pixel 11, of the color sub-pixel, the transparent sub-pixel or the sensing component in the two third sub-regions 111c at the right and left sides of the sub-regions 111 in the center of the pixel 11 equals to the area of the color sub-pixel, the transparent sub-pixel or the sensing component of the sub-region 111c in the center of the pixel 11. The summation of the area, which is in the same pixel 11, of the color sub-pixel, the transparent sub-pixel or the sensing component in the two third sub-regions 111c at the top and bottom sides of the sub-regions 111 in the center of the pixel 11 equals to the area of the color sub-pixel, the transparent sub-pixel or the sensing component of the sub-region 111c in the center of the pixel 11. Four fourth sub-regions 111e are respectively arranged at the four corners of the pixel 11. The fourth sub-regions 111e cross four pixels 11. The four fourth sub-regions 111e surround the sub-region 111. The summation of the area, which is in the same pixel 11, of the color sub-pixels, the transparent sub-pixels or the sensing components in the four fourth sub-regions 111e equals to the area of the color sub-pixel, the transparent sub-pixel or the sensing component of the sub-region 111 in the center of the pixel 11.

Figure 16:
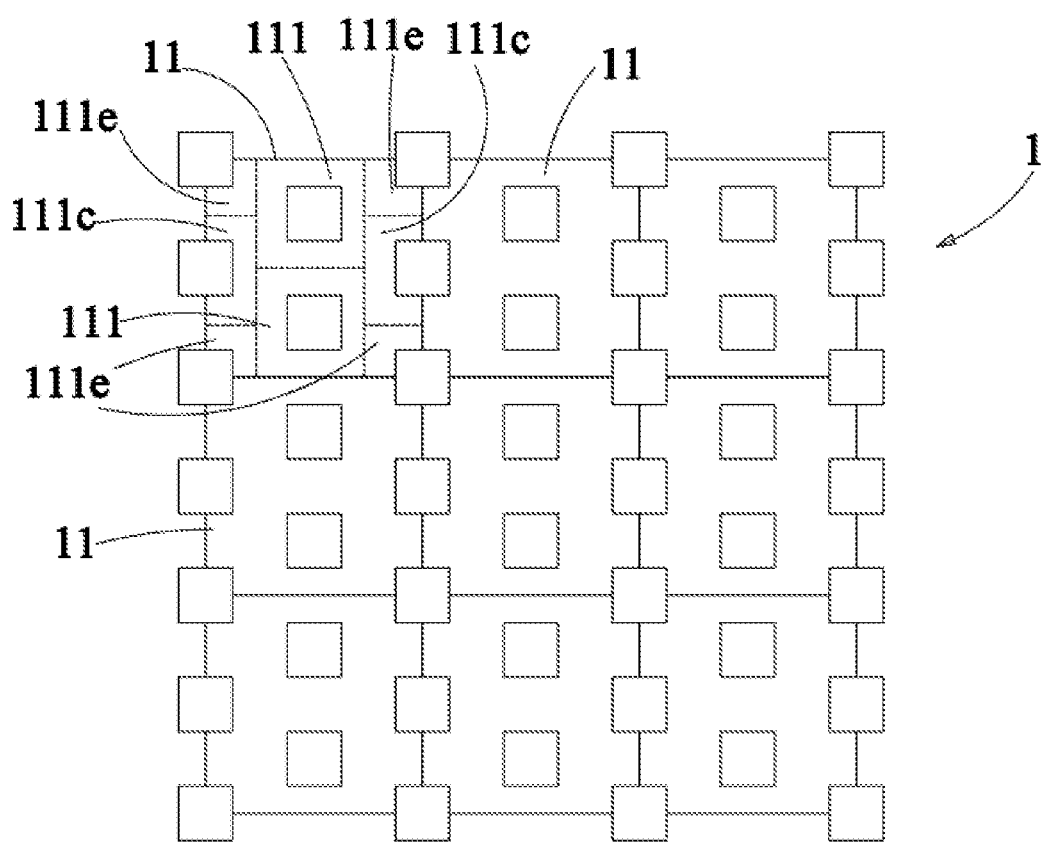
FIG. 16 is a schematic view showing the arrangement of the sub-region of the pixels of an organic light emitting diode display according to a sixteenth embodiment of the present disclosure.

Refer to FIG. 16, which is a schematic view showing the arrangement of the sub-region of the pixels of an organic light emitting diode display according to a sixteenth embodiment of the present disclosure. As shown in the figure, the pixel structure 1 of the organic light emitting diode display in this embodiment and the fifteenth embodiment lies in that the four sub-regions 111 have two complete sub-regions 111 in the center of the pixel 11. The other two sub-regions are shared with the adjacent pixels 11. In this embodiment, the third sub-regions 111c are respectively at the right and left side of the sub-region 111 in the center of the pixel. The summation of the area, which is in the same pixel 11, of the color sub-pixel, the transparent sub-pixel or the sensing component in the two third sub-regions 111c at the right and left sides of the sub-regions 111 in the center of the pixel 11 equals to the area of the color sub-pixel, the transparent sub-pixel or the sensing component of the sub-region 111 in the center of the pixel 11. Four fourth sub-regions 111e are respectively arranged at the four corners of the pixel 11. The four fourth sub-regions 111e surround the sub-region 111. The summation of the area, which is in the same pixel 11, of the color sub-pixels, the transparent sub-pixels or the sensing components in the four fourth sub-regions 111d equals to the area of the color sub-pixel, the transparent sub-pixel or the sensing component of the sub-region 111 in the center of the pixel 11.

Figure 17:
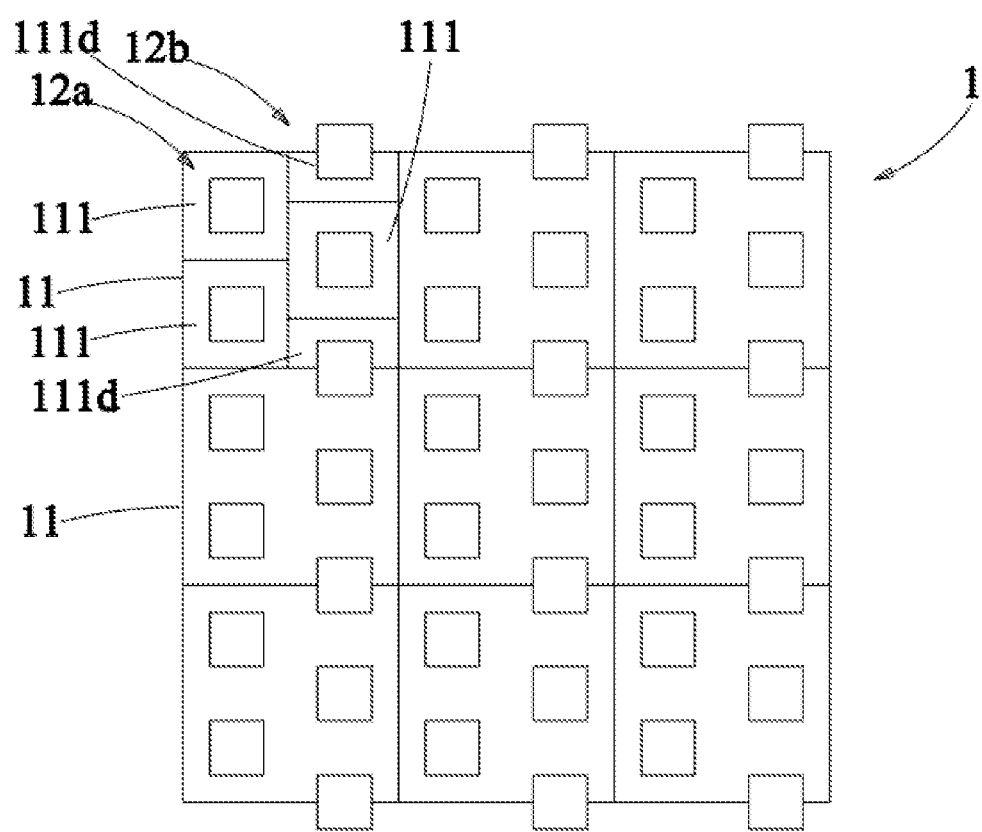
FIG. 17 is a schematic view showing the arrangement of the sub-region of the pixels of an organic light emitting diode display according to a seventeenth embodiment of the present disclosure.

Refer to FIG. 17, which is a schematic view showing the arrangement of the sub-region of the pixels of an organic light emitting diode display according to a seventeenth embodiment of the present disclosure. As shown in the figure, the pixel structure 1 of the organic light emitting diode display in this embodiment and the sixteenth and the fifteenth embodiment lies in that three sub-regions 111 of the four sub-regions 111 are completely arranged in the pixel 11. The amount of the sub-regions 111 of the first column 12a in the pixel 11 is 2. The amount of the sub-regions 111 of the second column 12b in the pixel 11 is 2. Only one sub-region 111 of the two sub-regions at the second column 12b is completely arranged in the pixel 11. The third sub-regions 111d are respectively arranged at the top and the bottom side of the sub-region 111 completely arranged in the pixel 11. In this embodiment, the summation of the area, which is in the same pixel 11, of the color sub-pixel, the transparent sub-pixel or the sensing component in the two third sub-regions 111d at the top and bottom sides of the sub-regions 111 in the center of the pixel 11 equals to the area of the color sub-pixel, the transparent sub-pixel or the sensing component of the sub-region 111 in the center of the pixel 11.

In summary, the present disclosure provides a pixel structure of an organic light emitting diode display, which mainly integrates a sensing component into the pixel structure of the organic light emitting diode display, and the sensing component is arranged in a light emitting region of the pixel of the pixel structure. The pixel structure formed by the above arrangement of the sub-regions of the above pixels has a sensing function in addition to the display function, and at the same time enables the display to have a resolution of more than 500 ppi.

It is to be understood that the term "comprises", "comprising", or any other variants thereof, is intended to encompass a non-exclusive inclusion, such that a process, method, article, or device of a series of elements not only includes those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A pixel structure of an organic light emitting diode display, comprising:
    a substrate; and
    a plurality of pixels arranged on the substrate;
        wherein each of the pixels is a light-emitting region, each of the pixels comprises a plurality of sub-regions arranged in a plurality of columns; each sub-region of each of the column of the pixels comprises a color sub-pixel, a transparent sub-pixel or a sensing component; at least one of the plurality of sub-regions of each pixel is the sensing component and the sensing component is arranged in the light-emitting region; and
        wherein the plurality of sub-regions of each of the pixels are divided into a first column and a second column at one side of the first column; the number of the sub-region of the first column is M, the number of the sub-region of the second column is N, and M=N; the number of the sub-regions of the first column and the number of the sub-regions of the second column is three; the sub-regions of the first column correspond to the sub-regions of the second column;

wherein each of the pixels accommodates six sub-pixels; the six sub-pixels include four color sub-pixels, a transparent sub-pixel and a sensing component the four color sub-pixels, the transparent sub-pixel and the sensing component locate in each sub-region of each of the column of the pixels, respectively; the sensing component is arranged in the light-emitting region;

wherein the sub-regions of a first row and the sub-regions of a third row are shifted to the left or right in relative to two of the sub-regions of a second row; one of the sub-regions of the first row and one of the sub-regions of the third row is each located partially in a first pixel and partially in a second pixel that is adjacent to the first pixel, a first sub-pixel of the six sub-pixels is located in the one of the sub-regions of the first row such that the first sub-pixel is partially located in the first pixel and partially located in the second pixel, and a second sub-pixel of the six sub-pixels is located in the one of the sub-regions of the third row such that the second sub-pixel is partially located in the first pixel and partially located in the second pixel.

2. The pixel structure of an organic light emitting diode display according to claim 1, wherein the sub-regions of the first column are configured symmetrically to the sub-regions of the second column.

3. The pixel structure of an organic light emitting diode display according to claim 1, wherein an amount of the sub-regions of the first column and an amount of the sub-regions of the second column is three; the sub-regions are arranged in three rows; two of the sub-regions of the second row are shifted in relative to the sub-regions of the first row and the sub-regions of the third row; one of the two of the sub-regions of the second row crosses two adjacent pixels.

4. The pixel structure of an organic light emitting diode display according to claim 1 wherein a summation of an area in the same pixel for the color sub-pixel, the transparent sub-pixel or the sensing component of the two sub-regions crossing the two adjacent pixels in each of the pixel equals to a total of region of the color sub-pixel, the transparent sub-pixel or the sensing component of the sub-region in the same pixel.

5. The pixel structure of an organic light emitting diode display according to claim 3, wherein a summation of an area in the same pixel for the color sub-pixel, the transparent sub-pixel or the sensing component of the two sub-regions crossing the two adjacent pixels in each of the pixel equals to a total of region of the color sub-pixel, the transparent sub-pixel or the sensing component of the sub-region in the same pixel.

6. The pixel structure of an organic light emitting diode display according to claim 1, wherein a summation of an area in the same pixel for the color sub-pixel, the transparent sub-pixel or the sensing component of the two sub-regions crossing the two adjacent pixels in each of the pixel equals to the total of region of the color sub-pixel, the transparent sub-pixel or the sensing component of the sub-region in the same pixel.

7. The pixel structure of an organic light emitting diode display according to claim 1, wherein a shape of the color sub-pixel, the transparent sub-pixel or the sensing component of the plurality of sub-regions of each pixel is different.

8. The pixel structure of an organic light emitting diode display according to claim 1, wherein a shape of the color sub-pixel, the transparent sub-pixel or the sensing component of the sub-regions of each row of each pixel is different.

9. The pixel structure of an organic light emitting diode display according to claim 1, wherein a shape of the color sub-pixel, the transparent sub-pixel or the sensing component of the plurality of sub-regions in each pixel of each row is different, and a shape of the color sub-pixel, the transparent sub-pixel or the sensing component of the plurality of sub-regions in each pixel of each column is different.

10. The pixel structure of an organic light emitting diode display according to claim 1, wherein an amount of the sub-region of the first column is M, an amount of the sub-region of the second column is N, and M>N.

11. The pixel structure of an organic light emitting diode display according to claim 10, wherein when N is 2, M is N+1 or N+2.

12. The pixel structure of an organic light emitting diode display according to claim 11, wherein the sub-regions of the second column corresponds to the two adjacent sub-regions of the first column.

13. The pixel structure of an organic light emitting diode display according to claim 10, wherein when N is 1, M is N+1, N+2, N+3 or N+4.

14. The pixel structure of an organic light emitting diode display according to claim 13, wherein the sub-regions of the second column corresponds to M sub-regions of the first column.

15. The pixel structure of an organic light emitting diode display according to claim 1, wherein an amount of the sub-regions of the first column and the second column is three, the three sub-regions of the second column comprises a first sub-region and two second sub-regions arranged side by side horizontally, the first sub-region corresponds to the two adjacent sub-regions in the first column, the second sub-region corresponds to the sub-region in the first column.

16. The pixel structure of an organic light emitting diode display according to claim 10, wherein an arrangement of the plurality of sub-regions of the pixels of each column is the same.

17. The pixel structure of an organic light emitting diode display according to claim 11, wherein an arrangement of the plurality of sub-regions of the pixels of each column is the same.

18. The pixel structure of an organic light emitting diode display according to claim 12, wherein an arrangement of the plurality of sub-regions of the pixels of each column is the same.

19. The pixel structure of an organic light emitting diode display according to claim 13, wherein an arrangement of the plurality of sub-regions of the pixels of each column is the same.

20. The pixel structure of an organic light emitting diode display according to claim 14, wherein an arrangement of the plurality of sub-regions of the pixels of each column is the same.

21. The pixel structure of an organic light emitting diode display according to claim 15, wherein an arrangement of the plurality of sub-regions of the pixels of each column is the same.

22. The pixel structure of an organic light emitting diode display according to claim 10, wherein an arrangement of the plurality of sub-regions of the pixels of each row is contrary to an arrangement of the plurality of sub-regions of the adjacent pixel.

23. The pixel structure of an organic light emitting diode display according to claim 11, wherein an arrangement of the plurality of sub-regions of the pixels of each column is contrary to an arrangement of the plurality of sub-regions of the adjacent pixel.

24. The pixel structure of an organic light emitting diode display according to claim 12, wherein an arrangement of the plurality of sub-regions of the pixels of each column is contrary to an arrangement of the plurality of sub-regions of the adjacent pixel.

25. The pixel structure of an organic light emitting diode display according to claim 13, wherein an arrangement of the plurality of sub-regions of the pixels of each column is contrary to an arrangement of the plurality of sub-regions of the adjacent pixel.

26. The pixel structure of an organic light emitting diode display according to claim 14, wherein an arrangement of the plurality of sub-regions of the pixels of each column is contrary to an arrangement of the plurality of sub-regions of the adjacent pixel.

27. The pixel structure of an organic light emitting diode display according to claim 15, wherein an arrangement of the plurality of sub-regions of the pixels of each column is contrary to an arrangement of the plurality of sub-regions of the adjacent pixel.

28. The pixel structure of an organic light emitting diode display according to claim 1, wherein the plurality of sub-regions of each pixel are divided into a first column, a second column and a third column, an amount of the sub-regions in the first column is MI, an amount of the sub-regions in the second column is M2, and the amount of the sub-regions in the third column is M3.

29. The pixel structure of an organic light emitting diode display according to claim 28, wherein a sum of MI, M2, and M3 is 4 to 6, MI equals to M2, MI>M3, and M2>M3.

30. The pixel structure of an organic light emitting diode display according to claim 28, wherein a sum of MI, M2, and M3 is 4 to 6, MI>M2, MI>M3, and M2=M3.

31. The pixel structure of an organic light emitting diode display according to claim 28, wherein a sum of MI, M2, and M3 is 4 to 6, M2>MI, M2>M3, and M1=M3.

32. The pixel structure of an organic light emitting diode display according to claim 28, wherein a sum of MI, M2, and M3 is 6, and MI, and M2, and M3 are equivalent.

33. The pixel structure of an organic light emitting diode display according to claim 28, wherein a sum of MI, M2, and M3 is 6, and MI, and M2, and M3 are inequivalent.

34. The pixel structure of an organic light emitting diode display according to claim 1, wherein the color sub-pixel is a red sub-pixel, a green sub-pixel or a blue sub-pixel.

35. The pixel structure of an organic light emitting diode display according to claim 1, wherein the sensing component is a light sensing component, pressure touch sensing component, fingerprint sensing component, infrared light sensing component, heartbeat sensing component, photometric sensing component, iris identification components or eye tracking sensing component.

36. The pixel structure of an organic light emitting diode display according to claim 1, wherein the shape of the color sub-pixel, the transparent sub-pixel or the sensing component is triangle, square, rectangle, rhombic, pentagon, hexagon, polygon, circle, or ellipse.

37. A pixel structure of an organic light emitting diode display, comprising:
a substrate; and
a plurality of pixels arranged on the substrate;
wherein each of the pixels is a light-emitting region, each of the pixels comprises a plurality of sub-regions, the plurality of sub-regions of each of the pixels are divided into a first column and a second column at one side of the first column; the sub-regions of a first row and the sub-regions of a third row are shifted to the left or right in relative to two of the sub-regions of a second row, one of the sub-regions of the first row and one of the sub-regions of the third row is each located partially in a first pixel and partially in a second pixel that is adjacent to the first pixel, the number of the sub-region of the first column is M, the number of the sub-region of the second column is N, and M>N; when N is 2, M is N+2; each of the pixels accommodates four color sub-pixels, a transparent sub-pixel and a sensing component, the four color sub-pixels, the transparent sub-pixel and the sensing component are located in each sub-region of each of the column of the pixels, respectively; the sensing component is arranged in the light-emitting region.

38. A pixel structure of an organic light emitting diode display, comprising:
a substrate; and
a plurality of pixels arranged on the substrate;
wherein each of the pixels is a light-emitting region, each of the pixels comprises a plurality of sub-regions, the plurality of sub-regions of each of the pixels are divided into a first column and a second column at one side of the first column; the sub-regions of a first row and the sub-regions of a third row are shifted to the left or right in relative to two of the sub-regions of a second row, one of the sub-regions of the first row and one of the sub-regions of the third row is each located partially in a first pixel and partially in a second pixel that is adjacent to the first pixel, the number of the sub-region of the first column is M, the number of the sub-region of the second column is N, and M>N; when N is 1, M is N+1, N+2, N+3 or N+4; the sub-regions of the second column corresponds to M sub-regions of the first column; each of the pixels accommodates four color sub-pixels, a transparent sub-pixel and a sensing component, the four color sub-pixels, the transparent sub-pixel and the sensing component are located in each sub-region of each of the column of the pixels, respectively; the sensing component is arranged in the light-emitting region.

* * * * *